(12) United States Patent
Kim et al.

(10) Patent No.: US 8,823,153 B2
(45) Date of Patent: Sep. 2, 2014

(54) SEMICONDUCTOR PACKAGE (75) Inventors: Tae Hoon Kim, Gyunggi-do (KR); Seog Moon Choi, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 1 day.

(21) Appl. No.: 13/584,743

(22) Filed: Aug. 13, 2012

(65) Prior Publication Data

US 2013/0154070 A1 Jun. 20, 2013

(30) Foreign Application Priority Data

Dec. 16, 2011 (KR) .................. 10-2011-0136666

(51) Int. Cl.
*H01L 23/48* (2006.01)
(52) U.S. Cl.
USPC ........... 257/676; 257/666; 257/675; 257/712; 257/717; 257/723; 257/787; 257/E23.01; 257/E23.08
(58) Field of Classification Search
USPC ....................................................... 257/675
See application file for complete search history.

(56) References Cited

FOREIGN PATENT DOCUMENTS

| DE | 10 2006 040 838 A1 | 3/2008 | | |
|---|---|---|---|---|
| JP | 1998-012812 | 1/1998 | | |
| JP | 2005-136332 | 5/2005 | | |
| JP | 2006-134990 | * | 5/2006 | .............. H01L 21/52 |
| JP | 2008-124430 | * | 5/2008 | .............. H01L 25/07 |
| KR | 1020110014867 | 2/2011 | | |

OTHER PUBLICATIONS

Office action dated Apr. 29, 2013 from corresponding Korean Patent Application No. 10-2011-0136666 and its English summary provided by the client.
Office action dated May 24, 2013 from corresponding German Patent Application No. 102012005787.3 and its English translation provided by the clients.

* cited by examiner

*Primary Examiner* — Victor A Mandala
*Assistant Examiner* — William Harriston
(74) *Attorney, Agent, or Firm* — Ladas & Parry, LLP

(57) ABSTRACT

Disclosed herein is a semiconductor package. The semiconductor package includes: semiconductor elements, a first heat dissipation substrate formed under the semiconductor elements, a first lead frame electrically connecting the lower portions of the semiconductor elements to an upper portion of the first heat dissipation substrate, a second heat dissipation substrate formed over the semiconductor elements, and a second lead frame having a protrusion formed to be protruded from a lower surface thereof and electrically connecting the upper portions of the semiconductor elements to a lower portion of the second heat dissipation substrate.

19 Claims, 4 Drawing Sheets

FIG.5

SEMICONDUCTOR PACKAGE

CROSS REFERENCE TO RELATED APPLICATION

This application claims the benefit of Korean Patent Application No. 10-2011-0136666, filed on Dec. 16, 2011, entitled "Semiconductor Package", which is hereby incorporated by reference in its entirety into this application.

BACKGROUND OF THE INVENTION

1. Technical Field

The present invention relates to a semiconductor package.

2. Description of the Related Art

With the advancement of the electronics industry, providing small and high density power semiconductor modules while reducing the size of a semiconductor device have become the main focus, and as a result, the focus has narrowed on reducing the size of the modules. Integrating elements in a limited space causes an increase in heat generation, and such heat generation greatly affects the operation and a life span of power semiconductor modules, which has thus become an important issue.

This type of power semiconductor package is configured to have a structure in which a plurality of semiconductor elements are soldered on a single insulating substrate and a housing case is bonded thereto. And, the semiconductor element and the substrate, and the substrate and terminals inserted in the housing are connected to each other by wire bonding or soldering. Also, since a heat dissipation plate for dissipating heat of the semiconductor package is disposed only at a lower portion of the package, heat cannot be effectively dissipated (Korean Patent Laid Open Publication No. 10-2011-0014867).

SUMMARY OF THE INVENTION

The present invention has been made in an effort to provide a compact semiconductor package.

The present invention has also been made in an effort to provide a semiconductor package having an enhanced heat dissipation effect.

According to a preferred embodiment of the present invention, there is provided a semiconductor package including: a plurality of semiconductor elements; a first heat dissipation substrate formed under the semiconductor elements; a first lead frame electrically connecting the lower portions of the semiconductor elements to an upper portion of the first heat dissipation substrate; a second heat dissipation substrate formed over the semiconductor elements; and a second lead frame having a protrusion formed to be protruded from one surface thereof to the outside and electrically connecting the upper portions of the semiconductor elements to a lower portion of the second heat dissipation substrate.

The semiconductor package may further include: a spacer formed in a space between the first and second lead frames.

The semiconductor package may further include: a housing covering both sides of the first and second heat dissipation substrates to block an internal space formed between the first and second heat dissipation substrates from the outside.

At least one of the first and second lead frames may be formed to be protruded from the housing to the outside.

The semiconductor package may further include: an insulating resin filled in the internal space between the first and second heat dissipation substrates.

The semiconductor elements may include at least one of a power element and a control element.

The power element may be an insulated gate bi-polar transistor (IGBT).

The control element may be a diode.

The diode may be disposed such that a gate electrode thereof is in contact with the first lead frame.

The first and second lead frames may connect the plurality of semiconductor elements to each other in series or in parallel.

According to another preferred embodiment of the present invention, there is provided a semiconductor package including: a plurality of semiconductor elements each having the same thickness; a first heat dissipation substrate formed under the semiconductor elements; a first lead frame electrically connecting the lower portions of the semiconductor elements to an upper portion of the first heat dissipation substrate; a second heat dissipation substrate formed over the semiconductor elements; and a second lead frame electrically connecting the upper portions of the semiconductor elements to a lower portion of the second heat dissipation substrate.

The semiconductor package may further include: a spacer formed in a space between the first and second lead frames.

The semiconductor package may further include: a housing covering both sides of the first and second heat dissipation substrates to block an internal space formed between the first and second heat dissipation substrates from the outside.

At least one of the first and second lead frames may be formed to be protruded from the housing to the outside.

The semiconductor package may further include: an insulating resin filled in the internal space between the first and second heat dissipation substrates.

The semiconductor elements may include at least one of a power element and a control element.

The power element may be an insulated gate bi-polar transistor (IGBT).

The control element may be a diode.

The diode may be disposed such that a gate electrode thereof is in contact with the first lead frame.

The first and second lead frames may connect the plurality of semiconductor elements to each other in series or in parallel.

DESCRIPTION OF THE PREFERRED EMBODIMENTS

Various features and advantages of the present invention will be more obvious from the following description with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

The above and other objects, features and advantages of the present invention will be more clearly understood from the following detailed description taken in conjunction with the accompanying drawings. In the specification, in adding reference numerals to components throughout the drawings, it is to be noted that like reference numerals designate like components even though components are shown in different drawings. In describing the present invention, a detailed description of related known functions or configurations will be omitted so as not to obscure the gist of the present invention. In the description, the terms "first", "second", and so on are used to distinguish one element from another element, and the elements are not defined by the above terms.

Hereinafter, a semiconductor package according to preferred embodiments of the present invention will be described in detail with reference to the accompanying drawings.

Figure 1:
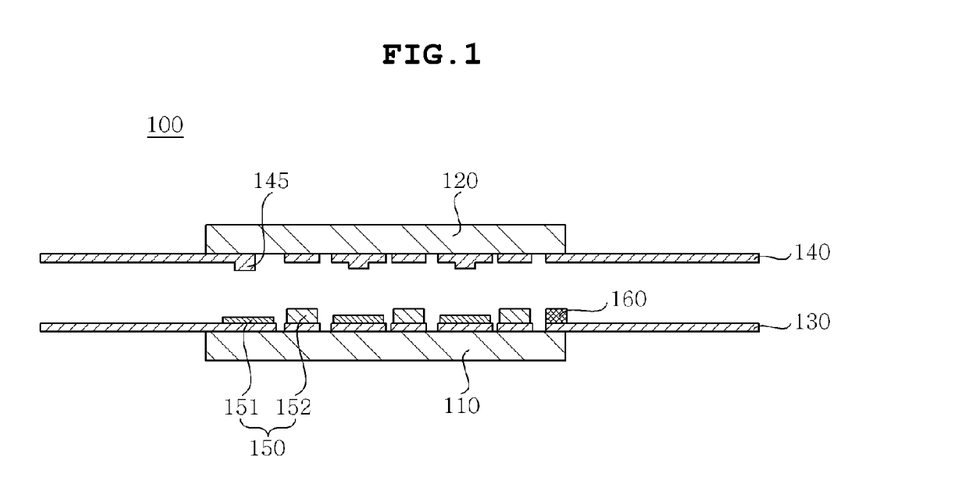
FIG. 1 is a view showing a semiconductor package according to a preferred embodiment of the present invention.

FIG. 1 is a view showing a semiconductor package according to a preferred embodiment of the present invention.

With reference to FIG. 1, a semiconductor package 100 may include a semiconductor element 150, a first heat dissipation substrate 110, a second heat dissipation substrate 120, a first lead frame 130, a second lead frame 140, and a spacer 160.

The first heat dissipation substrate 110 may be made of a material having high heat conductivity. For example, the first heat dissipation substrate 110 may be a heat sink radiating heat to the outside. The first heat dissipation substrate 110 may be made of metal, a metal nitride, a ceramic resin, or any combination thereof. The first lead frame 130 may be formed on the first heat dissipation substrate 110.

The second heat dissipation substrate 120 may be made of a material having high heat conductivity. For example, the second heat dissipation substrate 120 may be a heat sink radiating heat to the outside. The second heat dissipation substrate 120 may be made of metal, a metal nitride, a ceramic resin, or any combination thereof. The second lead frame 140 may be formed beneath the second heat dissipation substrate 120.

The first lead frame 130 may be formed on the first heat dissipation substrate 110. The first lead frame 130 may be electrically connected to the first heat dissipation substrate 110. Also, the first lead frame 130 may be electrically connected to the semiconductor element 150. Namely, the first lead frame 130 may electrically connect the first heat dissipation substrate 110 to the semiconductor element 150. The first lead frame 130 may be made of an electroconductive metal. Also, the first lead frame 130 may be made of a thermally conductive metal. The first lead frame 130 made of an electroconductive metal or a thermally conductive metal conducts heat generated from the semiconductor element 150 to the first heat dissipation substrate 110 to allow the heat to be discharged to the outside. The first lead frame 130 may be formed to be protruded from the first heat dissipation substrate 110 to the outside.

The semiconductor element 150 may include a power element and a control element. The semiconductor element 150 may be mounted on the first lead frame 130. When the semiconductor element 150 is mounted on the first lead frame 130, it may be bonded to the first lead frame 130 by a conductive adhesive. The conductive adhesive may be a solder, a conductive epoxy, or the like. The second lead frame 140 may be mounted on the semiconductor element 150.

The second lead frame 140 may be formed beneath the second heat dissipation substrate 120. The second lead frame 140 may be electrically connected to the second heat dissipation substrate 120. Also, the second lead frame 140 may be electrically connected to the semiconductor element 150. Namely, the second lead frame 140 may electrically connect the second heat dissipation substrate 120 to the semiconductor element 150. The second lead frame 140 may be made of an electroconductive metal. Also, the second lead frame 140 may be made of a thermally conductive metal. The second lead frame 140 made of an electroconductive metal or a thermally conductive metal may conduct heat generated from the semiconductor element 150 to the second heat dissipation substrate 120 to allow the heat to be discharged to the outside. The second lead frame 140 may be protruded from the second heat dissipation substrate 120 to the outside. A protrusion 145 may be formed on one surface of the second lead frame 140. The protrusion 145 may be formed to be protruded from the body of the second lead frame 140 to the outside. The protrusion 145 serves to alleviate a difference in thickness between a semiconductor element having a larger thickness and a semiconductor element having a smaller thickness, among the semiconductor elements 150. For example, a portion of the second lead frame 140 which is in contact with the diode 152, a thicker semiconductor element, does not have the protrusion 145, and a portion of the second lead frame 140 which is in contact with an insulated gate bi-polar transistor (IGBT) 151, a thinner semiconductor element, may have the protrusion 145. The thickness of the protrusion 145 serves to alleviate the difference in thickness between the semiconductor elements 150 mounted on the same substrate. Thus, the thickness of the protrusion 145 may be a difference in thickness between the thickest semiconductor element 150 and semiconductor elements 150 in contact with the protrusion 145, respectively. Namely, when the semiconductor elements 150 have various thicknesses, the protrusion 145 bonded thereto may have various thicknesses to correspond thereto.

The spacer 160 may be formed in a space between the first lead frame 130 and the second lead frame 140. In order to prevent the shape of the semiconductor package 100 from being changed by the empty space within the semiconductor package 100, the spacer 160 may be formed in the space between the first lead frame 130 and the second lead frame 140. Namely, the spacer 160 may be formed on a region on which the semiconductor elements 150 are not placed. The spacer 160 may be made of a thermally conductive material. Also, the spacer 160 may be made of an electrically non-conductive material. However, when the first lead frame 130 and the second lead frame 140 are required to be electrically connected to each other, the spacer 160 may be made of an electroconductive material According to a preferred embodiment of the present invention, reliability of the semiconductor package can be enhanced by implementing an electrical connection between the substrate and the semiconductor elements or an electrical connection between semiconductor elements through the lead frames, rather than through wire bonding.

Figure 2:
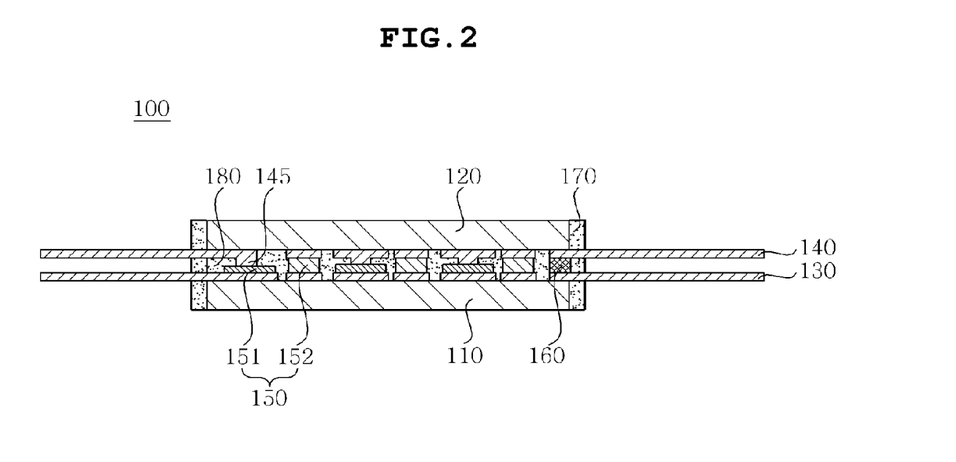
FIG. 2 is a view showing a semiconductor package packaged by a housing according to a preferred embodiment of the present invention.

FIG. 2 is a view showing a semiconductor package packaged by a housing according to a preferred embodiment of the present invention.

With reference to FIG. 2, the semiconductor package 100 may include the semiconductor elements 150, the first heat dissipation substrate 110, the second heat dissipation substrate 120, the first lead frame 130, the second lead frame 140, the spacer 160, and a housing 170.

The first heat dissipation substrate 110 may be made of a material having high heat conductivity. For example, the first heat dissipation substrate 110 may be a heat sink radiating heat to the outside. The first heat dissipation substrate 110 may be made of metal, a metal nitride, a ceramic resin, or any combination thereof. The first lead frame 130 may be formed on the first heat dissipation substrate 110.

The second heat dissipation substrate 120 may be made of a material having high heat conductivity. For example, the second heat dissipation substrate 120 may be a heat sink radiating heat to the outside. The second heat dissipation substrate 120 may be made of metal, a metal nitride, a ceramic resin, or any combination thereof. The second lead frame 140 may be formed beneath the second heat dissipation substrate 120.

The first lead frame 130 may be formed on the first heat dissipation substrate 110. The first lead frame 130 may be electrically connected to the first heat dissipation substrate 110. Also, the first lead frame 130 may be electrically connected to the semiconductor element 150. Namely, the first lead frame 130 may electrically connect the first heat dissipation substrate 110 to the semiconductor element 150. The first lead frame 130 may be made of an electroconductive metal. Also, the first lead frame 130 may be made of a thermally conductive metal. The first lead frame 130 made of an electroconductive metal or a thermally conductive metal conducts heat generated from the semiconductor element 150 to the first heat dissipation substrate 110 to allow the heat to be discharged to the outside. The first lead frame 130 may be formed to be protruded from the housing 170 to the outside.

The semiconductor element 150 may include a power element and a control element. The semiconductor element 150 may be mounted on the first lead frame 130. When the semiconductor element 150 is mounted on the first lead frame 130, it may be bonded to the first lead frame 130 by a conductive adhesive. The conductive adhesive may be a solder, a conductive epoxy, or the like. The second lead frame 140 may be mounted on the semiconductor element 150.

The second lead frame 140 may be formed beneath the second heat dissipation substrate 120. The second lead frame 140 may be electrically connected to the second heat dissipation substrate 120. Also, the second lead frame 140 may be electrically connected to the semiconductor element 150. Namely, the second lead frame 140 may electrically connect the second heat dissipation substrate 120 to the semiconductor element 150. The second lead frame 140 may be made of an electroconductive metal. Also, the second lead frame 140 may be made of a thermally conductive metal. The second lead frame 140 made of an electroconductive metal or a thermally conductive metal may conduct heat generated from the semiconductor element 150 to the second heat dissipation substrate 120 to allow the heat to be discharged to the outside. The second lead frame 140 may be protruded from the housing 170 to the outside. The protrusion 145 may be formed on one surface of the body of the second lead frame 140. The protrusion 145 may be formed to be protruded from the body of the second lead frame 140 to the outside. The protrusion 145 serves to alleviate a difference in thickness between a semiconductor element 150 having a larger thickness and a semiconductor element 150 having a smaller thickness, among the semiconductor elements 150. For example, a portion of the second lead frame 140 which is in contact with the diode 152, a thick semiconductor element, does not have the protrusion 145, and a portion of the second lead frame 140 which is in contact with an IGBT 151, a thin semiconductor element, may have the protrusion 145. The thickness of the protrusion 145 serves to alleviate the difference in thickness between the semiconductor elements 150 mounted on the same substrate. Thus, the thickness of the protrusion 145 may be a difference in thickness between the thickest semiconductor element 150 and semiconductor elements 150 in contact with the protrusion 145, respectively. Namely, when the semiconductor elements 150 have various thicknesses, the protrusion 145 may have various thicknesses to correspond thereto.

The spacer 160 may be formed in a space between the first lead frame 130 and the second lead frame 140. In order to prevent the shape of the semiconductor package 100 from being changed by the empty space within the semiconductor package 100, the spacer 160 may be formed in the space between the first lead frame 130 and the second lead frame 140. Namely, the spacer 160 may be formed on a region on which the semiconductor elements 150 are not placed. The spacer 160 may be made of a thermally conductive material. Also, the spacer 160 may be made of an electrically non-conductive material. However, when the first lead frame 130 and the second lead frame 140 are required to be electrically connected to each other, the spacer 160 may be made of an electroconductive material.

The housing 170 may be formed to block the internal space and the constituent components formed between the first and second heat dissipation substrates 110 and 120 from the outside. In order to block the internal constituent components and the outside, the housing 170 may be formed to have various shapes. For example, the housing 170 may have a structure to cover the sides of the first and second heat dissipation substrates 110 and 120 to block the interior and the exterior of the housing 170. Also, the housing 170 may have a structure to cover all sides of the first and second heat dissipation substrates 110 and 120 to block the interior and the exterior of the housing 170. The housing 170 may be made of an insulating material. The housing 170 may be charged with an insulating resin 180 such as silicon, or the like, in order to protect the constituent components located therein.

Figure 3:
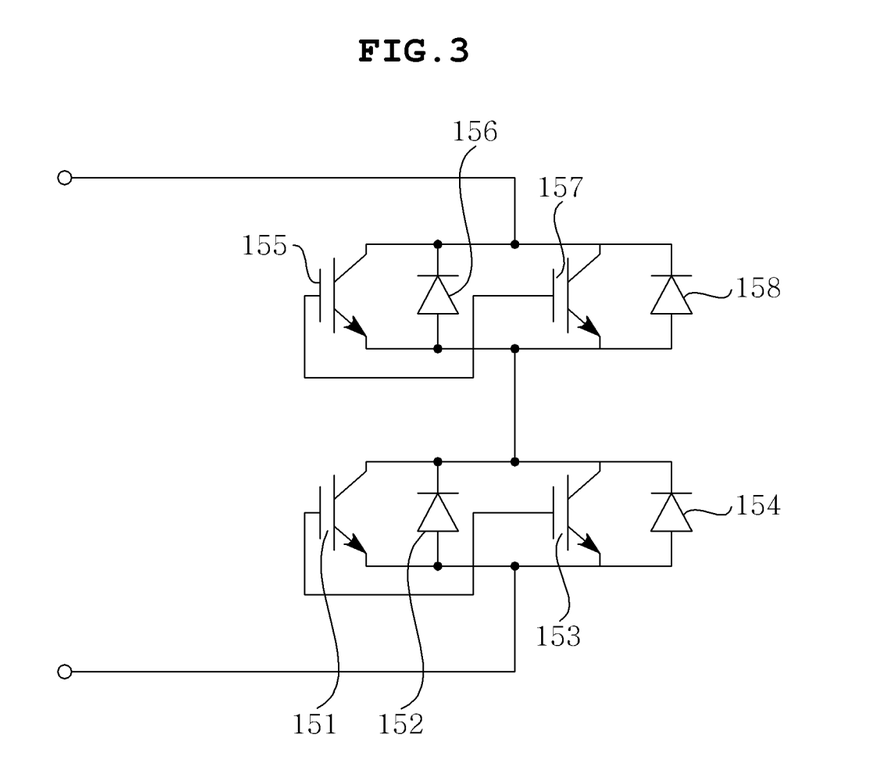
FIG. 3 is a circuit diagram including a semiconductor element according to a preferred embodiment of the present invention.

FIG. 3 is a circuit diagram including the semiconductor element according to a preferred embodiment of the present invention.

With reference to FIG. 3, the semiconductor element 150 may include first, second, third, and fourth power elements 151, 153, 155, and 157, and first to fourth control elements 152, 154, 156, and 158. For example, the first, second, third, and fourth power elements 151, 153, 155, and 157 may be IGBTs. Also, the first to fourth control elements 152, 154, 156, and 158 may be diodes.

With reference to the circuit diagram of FIG. 3, the first power element 151 and the first control element 152 are connected to each other in parallel. The second power element 153 and the second control element 154 are connected to each other in parallel. The third power element 155 and the third control element 156 are connected to each other in parallel. Also, the fourth power element 157 and the fourth control element 158 are connected to each other in parallel.

Here, it can be seen that the first power element 151 and the first control element 152 are connected in parallel to the third power element 155 and the third control element 156.

Figure 4:
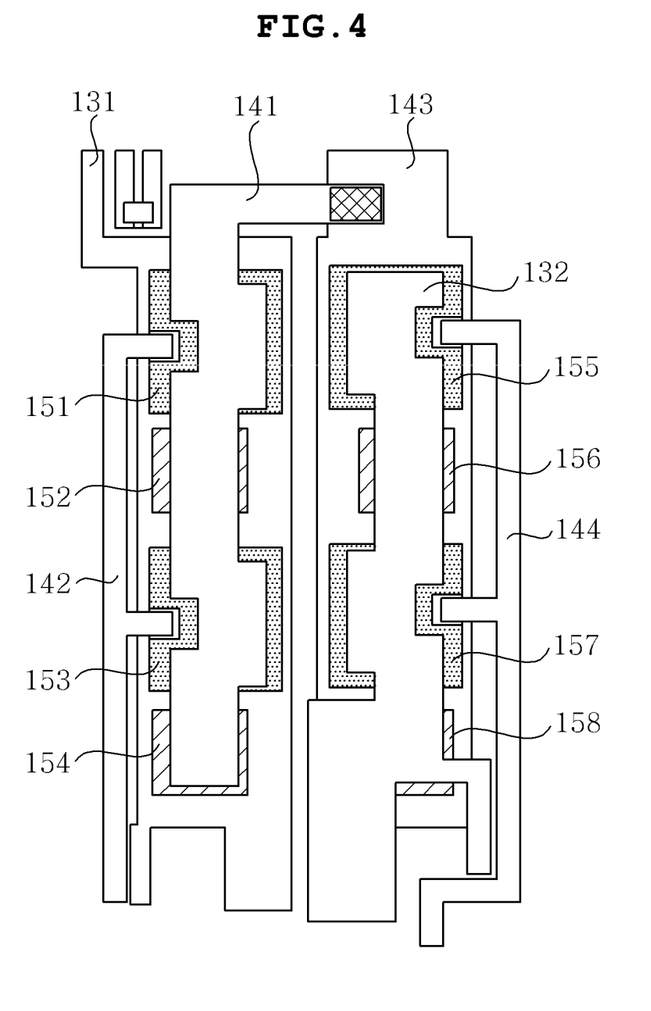
FIG. 4 is a view showing a wiring structure of the semiconductor package according to a preferred embodiment of the present invention.

FIG. 4 is a view showing a wiring structure of the semiconductor package according to a preferred embodiment of the present invention.

FIG. 4 is a view showing a wiring layout of the circuit diagram of FIG. 3.

With reference to FIG. 4, a plurality of semiconductor elements 150 may be connected to each other by lead frames 131, 132, 141, 142, 143, and 144.

The semiconductor elements 150 may include the first, second, third, and fourth power elements 151, 153, 155, and 157, and the first, second, third, and fourth control elements, 152, 154, 156, and 158. For example, the first, second, third, and fourth power elements 151, 153, 155, and 157 may be IGBTs. Also, the first to fourth control elements 152, 154, 156, and 158 may be diodes.

The lead frames 131, 132, 141, 142, 143, and 144 may electrically connect the semiconductor elements 150 to each other. The lead frames 131, 132, 141, 142, 143, and 144 may be patterned to electrically connect the semiconductor elements 150 to each other by designing. The lead frames 131, 132, 141, 142, 143, and 144 may include the first lead frame 130 bonded to the lower portions of the semiconductor elements 150 and the second lead frame 140 bonded to the upper portions of the semiconductor element 150. According to a preferred embodiment of the present invention, one or more first lead frames 130 and second lead frames 140 may be patterned to have various shapes so as to be electrically connected to the semiconductor elements 150 according to design.

The first power element 151, the second power element 153, the first control element 152, and the second control element 154 may be connected by (1-1)th lead frame 131, (2-1-1)th lead frame 141, and (2-1-2)th lead frame 142. For example, a collector of the first power element 151, a cathode of the first control element 152, a collector of the second power element 153, and a cathode of the second control element 154 may be bonded to and electrically connected to the (1-1)th lead frame 131. Also, an emitter of the first power element 151, an anode of the first control element 152, an emitter of the second power element 153, and an anode of the second control element 154 may be bonded to and electrically connected to the (2-1-1)th lead frame 141. Also, a gate of the first power element 151 and that of the second power element 153 may be bonded to and electrically connected to the (2-1-2)th lead frame 142. In this manner, in the semiconductor package 100 according to a preferred embodiment of the present invention, since the gates of the first power element 151 and the second power element 153 are connected to each other by the lead frame, an existing solder ball process for a connection by solder balls may be omitted.

In this manner, the first power element 151, the first control element 152, the second power element 153, and the second control element 154 may be connected to each other in parallel by the (1-1)th lead frame 131, the (2-1-1)th lead frame 141, and the (2-1-2)th lead frame 142.

The third power element 155, the fourth power element 157, the third control element 156, and the fourth control element 158 may be connected by the (1-2)th lead frame 132, the (2-2-1)th lead frame 143, and the (2-2-2)th lead frame 144. For example, the collector of the third power element 155, the cathode of the third control element 156, the collector of the fourth power element 157, and the cathode of the fourth control element 158 may be bonded to and electrically connected to the (1-2)th lead frame 132. Also, the emitter of the third power element 155, the anode of the third control element 156, the emitter of the fourth power element 157, and the anode of the fourth control element 158 may be bonded to and electrically connected to the (2-2-1)th lead frame 143. Also, the gate of the third power element 155 and that of the fourth power element 157 may be bonded to and electrically connected to the (2-2-2)th lead frame 142. In the semiconductor package 100 according to a preferred embodiment of the present invention, since the gates of the third power element 155 and the fourth power element 157 are connected by the lead frame, an existing solder ball process for a connection by solder balls may be omitted.

In this manner, the third power element 155, the third control element 156, the fourth power element 157, and the fourth control element 158 may be connected to each other in parallel by the (1-2)th lead frame 132, the (2-2-1)th lead frame 143, and the (2-2-2)th lead frame 144.

Also, the (2-1-1)th lead frame 141 may be connected to the (1-2)th lead frame 132. Thus, the first, second, third, and fourth power elements 151, 153, 155, and 157, and the first, second, third, and fourth control elements 152, 154, 156, and 158 may be connected to each other in series by the (2-1-1)th lead frame 141 and the (1-2)th lead frame 132.

In the preferred embodiment of the present invention, two power elements and two control elements are illustrated and described, but the number of semiconductor elements included in the semiconductor package is not limited thereto. Namely, the number of power elements and control elements included in the semiconductor package may be changed by a person skilled in the art. Also, the design of patterning the lead frames may be changed by a person skilled in the art, whereby connections in series or in parallel between a plurality of semiconductor elements can be easily changed.

Figure 5:
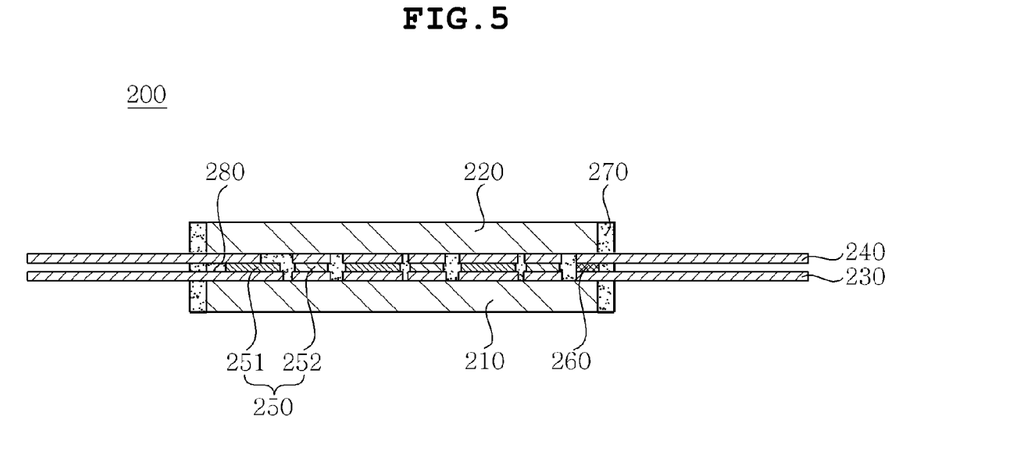
FIG. 5 is a view showing a semiconductor package according to another preferred embodiment of the present invention.

FIG. 5 is a view showing a semiconductor package according to another preferred embodiment of the present invention.

With reference to FIG. 5, a semiconductor package 200 may include a semiconductor element 250, a first heat dissipation substrate 210, a second heat dissipation substrate 220, a first lead frame 230, a second lead frame 240, a spacer 260, and a housing 270.

The first heat dissipation substrate 210 may be made of a material having high heat conductivity. For example, the first heat dissipation substrate 210 may be a heat sink radiating heat to the outside. The first heat dissipation substrate 210 may be made of metal, a metal nitride, a ceramic resin, or any combination thereof. The first lead frame 230 may be formed on the first heat dissipation substrate 210.

The second heat dissipation substrate 220 may be made of a material having high heat conductivity. For example, the second heat dissipation substrate 220 may be a heat sink radiating heat to the outside. The second heat dissipation substrate 220 may be made of metal, a metal nitride, a ceramic resin, or any combination thereof. The second lead frame 240 may be formed beneath the second heat dissipation substrate 220.

The first lead frame 230 may be formed on the first heat dissipation substrate 210. The first lead frame 230 may be electrically connected to the first heat dissipation substrate 210. Also, the first lead frame 230 may be electrically connected to the semiconductor element 250. Namely, the first lead frame 230 may electrically connect the first heat dissipation substrate 210 to the semiconductor element 250. The first lead frame 230 may be made of an electroconductive metal. Also, the first lead frame 230 may be made of a thermally conductive metal. The first lead frame 230 made of an electroconductive metal or a thermally conductive metal conducts heat generated from the semiconductor element 250 to the first heat dissipation substrate 210 to allow the heat to be discharged to the outside. The first lead frame 230 may be formed to be protruded from the housing 270 to the outside.

The semiconductor element 250 may include a power element and a control element. Here, all the semiconductor elements 250 may have the same thickness. For example, among the semiconductor elements 250, the power element may be an IGBT 251. Also, among the semiconductor elements 250, the control element may be a diode 252. The diode 252 may have a thickness greater than that of the IGBT 251. The diode 252 thicker than the IGBT 251 may have the same thickness as that of the IGBT 251 through a thinning process.

The semiconductor elements 250 having the same thickness may be mounted on the first lead frame 230. When the semiconductor element 250 is mounted on the first lead frame 230, it may be bonded to the first lead frame 230 by a conductive adhesive. The conductive adhesive may be a solder, a conductive epoxy, or the like. The second lead frame 240 may be mounted on the semiconductor element 250.

The second lead frame 240 may be formed beneath the second heat dissipation substrate 220. The second lead frame 240 may be electrically connected to the second heat dissipation substrate 220. Also, the second lead frame 240 may be electrically connected to the semiconductor element 250. Namely, the second lead frame 240 may electrically connect the second heat dissipation substrate 220 to the semiconductor element 250. The second lead frame 240 may be made of an electroconductive metal. Also, the second lead frame 240 may be made of a thermally conductive metal. The second lead frame 240 made of an electroconductive metal or a thermally conductive metal may conduct heat generated from the semiconductor element 250 to the second heat dissipation substrate 220 to allow the heat to be discharged to the outside. The second lead frame 240 may be protruded from the housing 270 to the outside.

The spacer 260 may be formed in a space between the first lead frame 230 and the second lead frame 240. In order to prevent the shape of the semiconductor package 200 from being changed by the empty space within the semiconductor package 200, the spacer 260 may be formed in the space between the first lead frame 230 and the second lead frame 240. Namely, the spacer 260 may be formed on a region on which the semiconductor elements 250 are not placed. The spacer 260 may be made of a thermally conductive material. Also, the spacer 260 may be made of an electrically non-conductive material. However, when the first lead frame 230 and the second lead frame 240 are required to be electrically connected to each other, the spacer 260 may be made of an electroconductive material.

The housing 270 may be formed to block the internal space and the constituent components formed between the first and second heat dissipation substrates 210 and 220 from the outside. In order to block the internal constituent components and the outside, the housing 270 may be formed to have various shapes. For example, the housing 270 may have a structure to cover the sides of the first and second heat dissipation substrates 210 and 220 to block the interior and the exterior of the housing 270. Also, the housing 270 may have a structure to cover all sides of the first and second heat dissipation substrates 210 and 220 to block the interior and the exterior of the housing 270. The housing 270 may be made of an insulating material. The housing 270 may be charged (or filled) with an insulating resin 280 such as silicon, or the like, in order to protect the constituent components located therein.

According to the preferred embodiments of the present invention, the semiconductor package can be formed to have a small size.

The semiconductor package can have an enhanced heat dissipation effect.

Although the preferred embodiments of the present invention have been disclosed for illustrative purposes, they are for specifically explaining the present invention and thus a semiconductor package according to the present invention is not limited thereto, but those skilled in the art will appreciate that various modifications, additions and substitutions are possible, without departing from the scope and spirit of the invention as disclosed in the accompanying claims.

Accordingly, any and all modifications, variations or equivalent arrangements should be considered to be within the scope of the invention, and the detailed scope of the invention will be disclosed by the accompanying claims.

What is claimed is:

1. A semiconductor package comprising:
a plurality of semiconductor elements;
a first heat dissipation substrate formed under the semiconductor elements;
a first lead frame electrically connecting the lower portions of the semiconductor elements to an upper portion of the first heat dissipation substrate;
a second heat dissipation substrate formed over the semiconductor elements; and
a second lead frame having a plurality of protrusions formed to be protruded from one surface thereof to the outside and electrically connecting the upper portions of the semiconductor elements to a lower portion of the second heat dissipation substrate,
wherein a thickness of the protrusion is a difference in thickness between the thickest semiconductor element and semiconductor elements in contact with the protrusions, respectively, and
wherein the thickest semiconductor element is directly connected to the second lead frame without using the protrusion.

2. The semiconductor package as set forth in claim 1, further comprising: a spacer formed in a space between the first and second lead frames.

3. The semiconductor package as set forth in claim 1, further comprising: a housing covering both sides of the first and second heat dissipation substrates to block an internal space formed between the first and second heat dissipation substrates from the outside.

4. The semiconductor package as set forth in claim 3, wherein at least one of the first and second lead frames is formed to be protruded from the housing to the outside.

5. The semiconductor package as set forth in claim 1, further comprising: an insulating resin filled in the internal space between the first and second heat dissipation substrates.

6. The semiconductor package as set forth in claim 1, wherein the semiconductor elements include at least one of a power element and a control element.

7. The semiconductor package as set forth in claim 6, wherein the power element is an insulated gate bi-polar transistor (IGBT).

8. The semiconductor package as set forth in claim 6, wherein the control element is a diode.

9. The semiconductor package as set forth in claim 8, wherein the diode is disposed such that a cathode electrode thereof is in contact with the first lead frame.

10. The semiconductor package as set forth in claim 1, wherein the first and second lead frames connect the plurality of semiconductor elements to each other in series or in parallel.

11. A semiconductor package comprising:
a plurality of semiconductor elements each having the same thickness;
a first heat dissipation substrate formed under the semiconductor elements;
a first lead frame electrically connecting the lower portions of the semiconductor elements to an upper portion of the first heat dissipation substrate;
a second heat dissipation substrate formed over the semiconductor elements;
a second lead frame electrically connecting the upper portions of the semiconductor elements to a lower portion of the second heat dissipation substrate; and a spacer formed in a space between the first and second lead frames, wherein the second lead frame is plate-shaped without a protrusion, and the semiconductor elements are directly connected to the second lead frame without using the protrusion.

12. The semiconductor package as set forth in claim 11, further comprising:

a housing covering both sides of the first and second heat dissipation substrates to block an internal space formed between the first and second heat dissipation substrates from the outside.

13. The semiconductor package as set forth in claim 12, wherein at least one of the first and second lead frames is formed to be protruded from the housing to the outside.

14. The semiconductor package as set forth in claim 11, further comprising:

an insulating resin filled in the internal space between the first and second heat dissipation substrates.

15. The semiconductor package as set forth in claim 11, wherein the semiconductor elements include at least one of a power element and a control element.

16. The semiconductor package as set forth in claim 15, wherein the power element is an insulated gate bi-polar transistor (IGBT).

17. The semiconductor package as set forth in claim 15, wherein the control element is a diode.

18. The semiconductor package as set forth in claim 17, wherein the diode is disposed such that a cathode electrode thereof is in contact with the first lead frame.

19. The semiconductor package as set forth in claim 11, wherein the first and second lead frames connect the plurality of semiconductor elements to each other in series or in parallel.

* * * * *